(12) United States Patent
Mori

(10) Patent No.: US 8,604,607 B2
(45) Date of Patent: Dec. 10, 2013

(54) SEMICONDUCTOR MODULE AND SEMICONDUCTOR DEVICE

(75) Inventor: Kazuhito Mori, Kawanishi (JP)

(73) Assignee: Miyoshi Electronics Corporation, Hiroshima (JP)

(*) Notice: Subject to any disclaimer, the term of this patent is extended or adjusted under 35 U.S.C. 154(b) by 328 days.

(21) Appl. No.: 13/039,485

(22) Filed: Mar. 3, 2011

(65) Prior Publication Data

US 2011/0298112 A1    Dec. 8, 2011

(30) Foreign Application Priority Data

Jun. 8, 2010    (JP) .................... 2010-131158

(51) Int. Cl.
*H01L 23/10*    (2006.01)
*H01L 23/34*    (2006.01)

(52) U.S. Cl.
USPC ..................... 257/706; 257/704; 257/713

(58) Field of Classification Search
USPC ............... 257/675, 676, 706, 690, 730, 684, 257/E23.051, E25.016, 704, 713
See application file for complete search history.

(56) References Cited

U.S. PATENT DOCUMENTS

| | | | |
|---|---|---|---|
| 3,982,271 A | 9/1976 | Olivieri et al. | |
| 5,610,799 A * | 3/1997 | Kato | 361/752 |
| 5,977,633 A | 11/1999 | Suzuki et al. | |
| 6,166,435 A * | 12/2000 | Leu et al. | 257/704 |
| 6,297,549 B1 * | 10/2001 | Hiyoshi | 257/703 |
| 6,489,668 B1 | 12/2002 | Oda et al. | |
| 6,538,319 B2 * | 3/2003 | Terui | 257/704 |
| 6,559,536 B1 * | 5/2003 | Katoh et al. | 257/712 |
| 7,719,110 B2 * | 5/2010 | Zhao et al. | 257/707 |
| 2001/0009302 A1 * | 7/2001 | Murayama et al. | 257/704 |
| 2006/0284289 A1 * | 12/2006 | Fluhrer et al. | 257/675 |
| 2007/0132110 A1 | 6/2007 | Fujita et al. | |

FOREIGN PATENT DOCUMENTS

| | | |
|---|---|---|
| JP | 4-174547 A | 6/1992 |
| JP | 6-61396 A | 3/1994 |
| JP | 2007-165442 A | 6/2007 |

* cited by examiner

*Primary Examiner* — Nitin Parekh

(74) *Attorney, Agent, or Firm* — Birch, Stewart, Kolasch & Birch, LLP.

(57) ABSTRACT

A semiconductor module includes a semiconductor chip, base frame, a circuit board, and a screw. The base frame has a main surface having a concave portion in which the semiconductor chip is mounted. The base frame is thermally and electrically connected with the semiconductor chip through a die bonding material. The circuit board has a grounding pattern and is arranged above the main surface of the base frame. The screw electrically connects the main surface of the base frame and the outer peripheral portion of the concave portion to the grounding pattern of the circuit board and mechanically connects the base frame to the circuit board.

7 Claims, 10 Drawing Sheets

SEMICONDUCTOR MODULE AND SEMICONDUCTOR DEVICE

This nonprovisional application is based on Japanese Patent Application No. 2010-131158 filed on Jun. 8, 2010 with the Japan Patent Office, the entire contents of which are hereby incorporated by reference.

BACKGROUND OF THE INVENTION

1. Field of the Invention

The present invention relates to a semiconductor module and a semiconductor device. More particularly, the present invention relates to a structure for separating dissipation of heat generated in a semiconductor device from grounding of a circuit.

2. Description of the Background Art

In semiconductor devices, in order to stabilize operation, it is required to efficiently release heat generated by semiconductor elements.

For example, Japanese Patent Laying-Open No. 4-174547 discloses a structure of a lead frame for a power semiconductor device. According to Japanese Patent Laying-Open No. 4-174547, a die pad of a lead frame is formed thicker than an outer lead of the lead frame. Heat generated in a semiconductor chip is absorbed in the die pad. The increased thickness of the die pad facilitates heat dissipation from the semiconductor chip. The surface of the die pad that is opposite to the surface provided with the semiconductor chip is exposed without being covered with resin. The exposed surface is brought into contact, for example, with a heat radiation fin, thereby facilitating dissipation of heat generated by the semiconductor chip.

Japanese Patent Laying-Open No. 6-61396 discloses a lead frame for improving a heat dissipation effect while the characteristics of a semiconductor device are maintained. This lead frame includes a stage on which a semiconductor chip is mounted. A heat sink plate is attached on the back surface of the stage.

Japanese Patent Laying-Open No. 2007-165442 discloses a mold package capable of improving heat dissipation and high-frequency characteristics. This mold package has a thick lead electrode connected with a semiconductor chip, and a thin lead electrode thinner than the thick lead electrode. The lower surface of the thick lead electrode is exposed on the lower surface of the package and is used as a heat dissipation electrode. On the other hand, part of the upper surface of the thick lead electrode is exposed on the upper surface of the package and is used as a grounding electrode.

For semiconductor devices operating at high frequency or high power, in particular, grounding of a semiconductor chip is important. In many cases, the back surface electrode of the semiconductor chip is used as a grounding electrode and is electrically connected with a lead frame via a die bonding pad. The potential of the grounding electrode can be stabilized more as the number of paths of ground current output from the back surface of the semiconductor chip is increased. However, Japanese Patent Laying-Open Nos. 4-174547 and 6-61396 do not disclose a specific structure for securing a path of ground current.

On the other hand, size reduction is required in a module including a circuit board and a semiconductor device operating at high frequency or higher power. According to the structure disclosed in Japanese Patent Laying-Open No. 2007-165442, the grounding electrode and the heat dissipation electrode are arranged on the upper surface and the lower surface of the package, respectively, so that ground current and thermal flow can be separated from each other such that the direction of ground current and the direction of thermal flow are opposite to each other. Thus, the module can be reduced in size. However, according to the structure disclosed in Japanese Patent Laying-Open No. 2007-165442, the path of ground current is limited to the path formed by the thick lead electrode. In view of stable operation of semiconductor devices, a larger number of ground paths is preferable.

SUMMARY OF THE INVENTION

The present invention is made to solve the aforementioned problem. An object of the present invention is to achieve size reduction of a semiconductor module, efficient heat dissipation, and reliable grounding.

A semiconductor module according to an aspect of the present invention includes at least one semiconductor chip, a base frame, a circuit board, a first lead terminal, and a connection member. The base frame has a main surface having a concave portion in which at least one semiconductor chip is mounted. The base frame is thermally and electrically connected with at least one semiconductor chip. The circuit board has a first grounding pattern and is arranged on the main surface of the base frame. The first lead terminal is integrally formed with the base frame and is connected to the first grounding pattern of the circuit board. The connection member electrically connects an outer peripheral portion of the concave portion that is a part of the main surface of the base frame, to the first grounding pattern of the circuit board. The connection member mechanically connects the base frame to the circuit board.

According to the structure described above, the circuit board is arranged on the main surface of the base frame. Ground current output from the semiconductor chip flows toward the first grounding pattern of the circuit board. Therefore, ground current flows upward from the semiconductor chip. On the other hand, heat produced in the semiconductor chip is dissipated via the base frame. Therefore, the direction of current and the direction of thermal flow can be separated from each other, thereby achieving efficient heat dissipation and size reduction of the semiconductor module. Furthermore, each of the first lead terminal and the connection member forms a path through which ground current flows. Accordingly, reliable grounding of the semiconductor chip can be achieved.

Preferably, the base frame includes a protrusion portion formed to extend from a bottom surface of the concave portion toward the main surface. The circuit board further has a second grounding pattern being connected to the protrusion portion and having a potential equal to a potential of the first grounding pattern. At least one semiconductor chip includes first and second semiconductor chips arranged in the concave portion such that the protrusion portion is sandwiched between the first and second semiconductor chips.

According to the structure described above, the protrusion portion sandwiched between the first and semiconductor chips forms a path of ground current. Accordingly, reliable grounding of the semiconductor chips can be achieved.

Preferably, the base frame further includes a heat dissipating surface being located opposite to the main surface and having a convex portion. The semiconductor module further includes a resin. The resin covers a part of the main surface of the base frame so as to fill the concave portion and covers a periphery of the convex portion.

According to the structure described above, the semiconductor chip can be protected against moisture or shocks. In addition, since the heat dissipating surface can be prevented from being entirely covered with resin, heat can be dissipated efficiently.

Preferably, a length of a part of the first lead terminal that protrudes from a surface of the resin is 0.15 mm or more.

According to the structure described above, the first lead terminal can be connected to the electrode pattern of the circuit board, for example, by solder.

Preferably, when a length in a direction vertical to the main surface of the base frame is defined as a height, the height of the first lead terminal with reference to a region of part of the main surface that is exposed from the resin is 0.3 mm or less.

According to the structure described above, the first lead terminal can be connected to the electrode pattern of the circuit board, for example, by solder.

Preferably, the connection member is a screw. A hole through which the screw is passed is formed in each of an outer peripheral portion of the main surface and the first grounding pattern of the circuit board. The semiconductor module further includes a heat sink. The heat sink is in contact with the convex portion of the heat dissipating surface and fixes the base frame and the circuit board by the screw. The outer peripheral portion of the main surface is brought into contact with the first grounding pattern by the screw.

According to the structure described above, the base frame can be electrically connected with the circuit board by the screw. Furthermore, the heat sink and the base frame can be brought into intimate contact with each other.

Preferably, a diameter of the hole is 2 mm or more.

According to the structure described above, a general screw can be used.

Preferably, the semiconductor module further includes a second lead terminal electrically connected with at least one semiconductor chip. A through hole is formed in the second lead terminal.

According to the structure described above, when the second lead terminal is connected to the circuit board by solder, the solder can easily spread over the surface of the second lead terminal. Another advantage is in that the second lead terminal can be shortened by cutting the second lead terminal at the location of the through hole.

A semiconductor device according to another aspect of the invention includes at least one semiconductor chip, a base frame, and a lead terminal. The base frame has a main surface having a concave portion in which at least one semiconductor chip is mounted. The base frame is thermally and electrically connected with at least one semiconductor chip. The lead terminal is integrally formed with the base frame and is connected to a grounding pattern of a circuit board arranged on the main surface of the base frame. A hole through which a connection member for mechanically and electrically connecting the base frame to the circuit board is passed is formed in an outer peripheral portion of the concave portion that is part of the main surface of the base frame.

According to the structure described above, the circuit board can be arranged on the main surface of the base frame. Thus, ground current can flow upward from the semiconductor chip. On the other hand, heat produced in the semiconductor chip is dissipated via the base frame. Therefore, the direction of current and the direction of thermal flow can be separated from each other, thereby achieving efficient heat dissipation and size reduction of the semiconductor module. Furthermore, each of the first lead terminal and the connection member forms a path through which ground current flows. Thus, reliable grounding of the semiconductor chip can be achieved.

In accordance with the present invention, the direction of thermal flow and the direction of flow of ground current can be separated from each other, and in addition, the number of paths of ground current can be increased. Therefore, in accordance with the present invention, size reduction of a semiconductor module, efficient heat dissipation, and reliable grounding can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the figures. It is noted that in the figures the same or corresponding parts are denoted with the same reference signs and a description thereof will not be repeated.

A high-frequency amplifier will be described below as a semiconductor module in accordance with an embodiment of the present invention. However, the present invention is applicable to a module having a circuit board and a semiconductor device. Therefore, the present invention is not limited only to the application of high-frequency amplifiers.

First Embodiment

Figure 1:
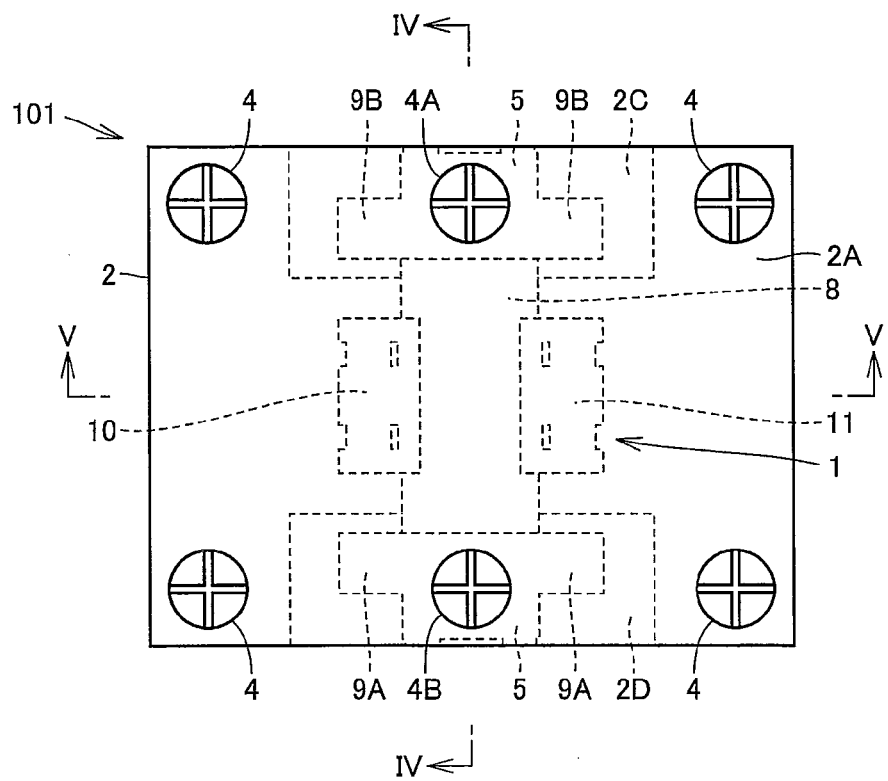
FIG. 1 is a top view of a semiconductor module in accordance with a first embodiment of the present invention.
Figure 2:
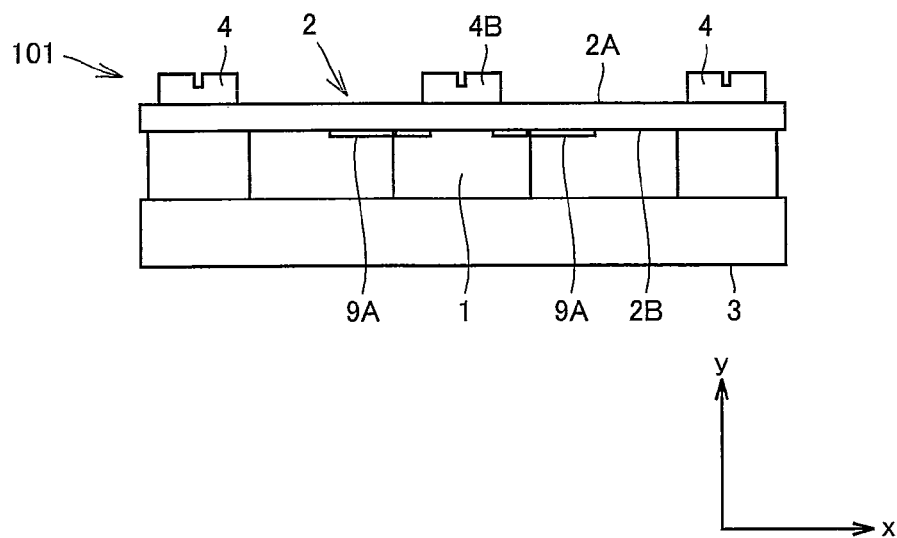
FIG. 2 is a front view of the semiconductor module shown in FIG. 1.

FIG. 1 is a top view of a semiconductor module in accordance with a first embodiment of the present invention. FIG. 2 is a front view of the semiconductor module shown in FIG. 1. In the following description, the height direction of a high-frequency amplifier 101 is defined as the y-axis direction and the horizontal direction of high-frequency amplifier 101 is defined as the x-axis direction.

Referring to FIG. 1 and FIG. 2, high-frequency amplifier 101 is a semiconductor module in accordance with the first embodiment of the present invention. High-frequency amplifier 101 includes a semiconductor device 1, a circuit board 2, a heat sink 3, and screws 4, 4A, 4B. Semiconductor device 1 has a base frame 5, a sealing resin 8, and lead terminals 9A, 9B, 10, 11.

Circuit board 2 is arranged on the upper side of semiconductor device 1. Circuit board 2 has main surfaces 2A and 2B located opposite to each other. Main surface 2A faces upward in high-frequency amplifier 101.

Heat sink 3 is arranged on the lower side of semiconductor device 1. Semiconductor device 1 is sandwiched between circuit board 2 and heat sink 3 and is fixed by screws 4A, 4B. Circuit board 2 is fixed to heat sink 3 by screws 4A, 4B and a plurality of screws 4. The number of screws 4 is not specifically limited.

Figure 3:
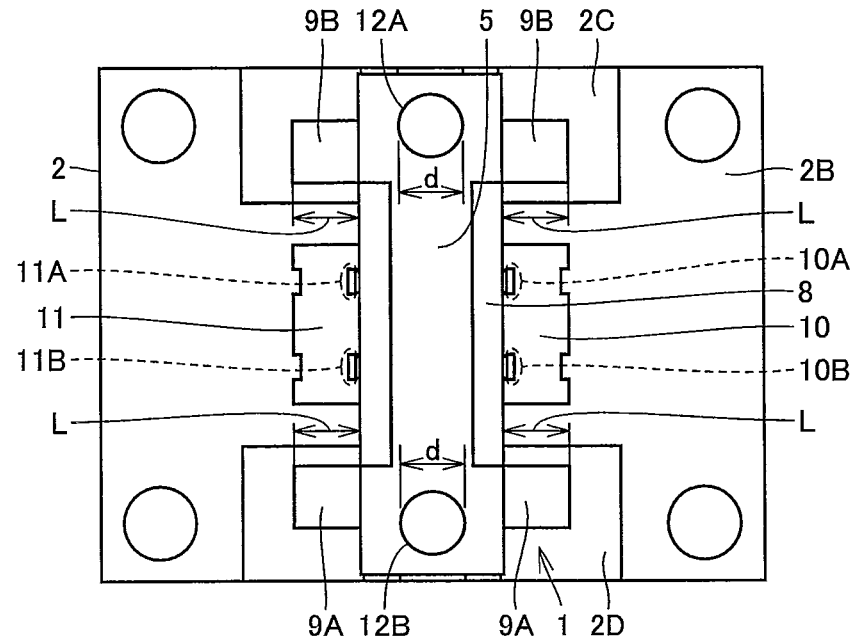
FIG. 3 is a plan view for illustrating a circuit board and a semiconductor device in accordance with the first embodiment.

FIG. 3 is a plan view for illustrating the circuit board and the semiconductor device in accordance with the first embodiment. Referring to FIG. 3 and FIG. 1, semiconductor device 1 is fixed to main surface 2B of circuit board 2 by a method such as reflow soldering. Through holes 12A and 12B through which screws 4A and 4B are passed, respectively, are formed in base frame 5. Two through holes corresponding to through holes 12A and 12B are formed in circuit board 2.

Diameter d shows the diameter of each of through holes 12A and 12B. Diameter d is preferably 2 mm or more. Thus, a general screw can be used in high-frequency amplifier 101. Therefore, the cost of high-frequency amplifier 101 can be reduced.

Circuit board 2 has an input matching circuit and an output matching circuit. Circuit board 2 has grounding patterns 2C, 2D having a ground potential. Grounding patterns 2C, 2D are electrode patterns for grounding of the input matching circuit and the output matching circuit.

Semiconductor device 1 has lead terminals 9A, 9B, 10, 11. Lead terminals 9A, 9B are integrated with base frame 5. Accordingly, lead terminals 9A, 9B are electrically connected with base frame 5. Lead terminals 9A, 9B protrude from sealing resin 8. Lead terminals 9A and 9B are electrically connected to grounding patterns 2C and 2D of circuit board 2, for example, by solder. As will be described in detail later, lead terminals 9A, 9B are electrically connected with the grounding electrode of the semiconductor element via base frame 5.

Let the length of lead terminals 9A, 9B each be L with respect to the side surface of sealing resin 8. Length L is preferably 0.15 mm or more. When length L is 0.15 mm or more, lead terminals 9A, 9B can be reliably connected to grounding patterns 2D, 2C of circuit board 2.

Circuit board 2 is fixed to heat sink 3 by screws 4, 4A, 4B, so that the dissipating surface of base frame 5 is in contact with heat sink 3. The heat dissipating surface is the surface of base frame 5 shown in FIG. 3. The heat dissipating surface of base frame 5 is in contact with heat sink 3, so that semiconductor device 1 is thermally connected to heat sink 3.

Lead terminal 10 is in contact with main surface 2B of circuit board 2 and is electrically connected to the input matching circuit of circuit board 2, for example, by solder. Lead terminal 11 is in contact with main surface 2B of circuit board 2 and is electrically connected to the output matching circuit of circuit board 2, for example, by solder.

Through holes 10A, 10B are formed in lead terminal 10. Similarly, through holes 11A, 11B are formed in lead terminal 11. Since the through holes are formed in each of lead terminal 10 and 11, solder can easily spread over the surface of each lead terminal. The shape of through holes 10A, 10B, 11A, 11B is rectangular in an embodiment, although any shape may be employed.

Figure 4:
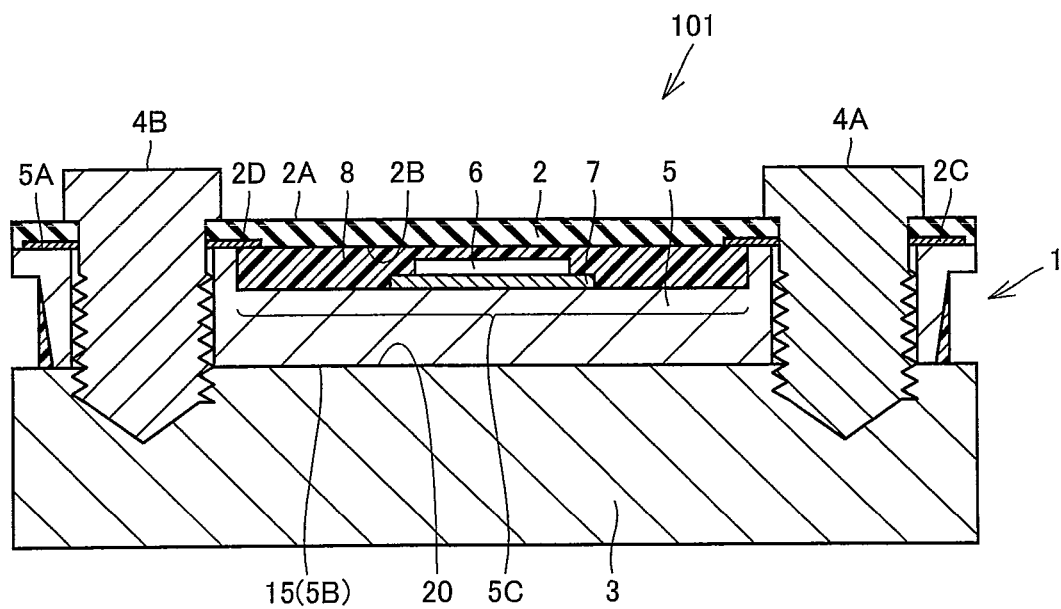
FIG. 4 is a cross-sectional view taken along IV-IV in FIG. 1.

FIG. 4 is a cross-sectional view taken along IV-IV in FIG. 1. Referring to FIG. 4, semiconductor device 1 includes conductive base frame 5, a semiconductor chip 6, a die bonding material 7, and sealing resin 8. The main component of base frame 5 is a metal (for example, copper). Base frame 5 has a main surface 5A. A concave portion 5C is formed in main surface 5A. The bottom surface of concave portion 5C is located lower than lead terminals 9A, 9B.

Base frame 5 further has a main surface 5B. Main surface 5B is located opposite to main surface 5A. Main surface 5B is in contact with a main surface 20 of heat sink 3. In other words, main surface 5B functions as a heat dissipating surface.

Semiconductor chip 6 is arranged in concave portion 5C of base frame 5. In the embodiment of the present invention, semiconductor chip 6 is a transistor device, more specifically, a FET (field-effect transistor). However, the kind of the semiconductor chip is not specifically limited. Die bonding material 7 electrically and mechanically connects semiconductor chip 6 to base frame 5. Die bonding material 7 is, for example, solder.

A grounding electrode is formed on the back surface of semiconductor chip 6. Semiconductor chip 6 is electrically and thermally connected with base frame 5 through die bonding material 7. Lead terminals 9A, 9B are connected with base frame 5 and connected with the grounding pattern of circuit board 2.

Sealing resin 8 fills concave portion 5C of base frame 5. Circuit board 2 is arranged on semiconductor device 1.

Figure 5:
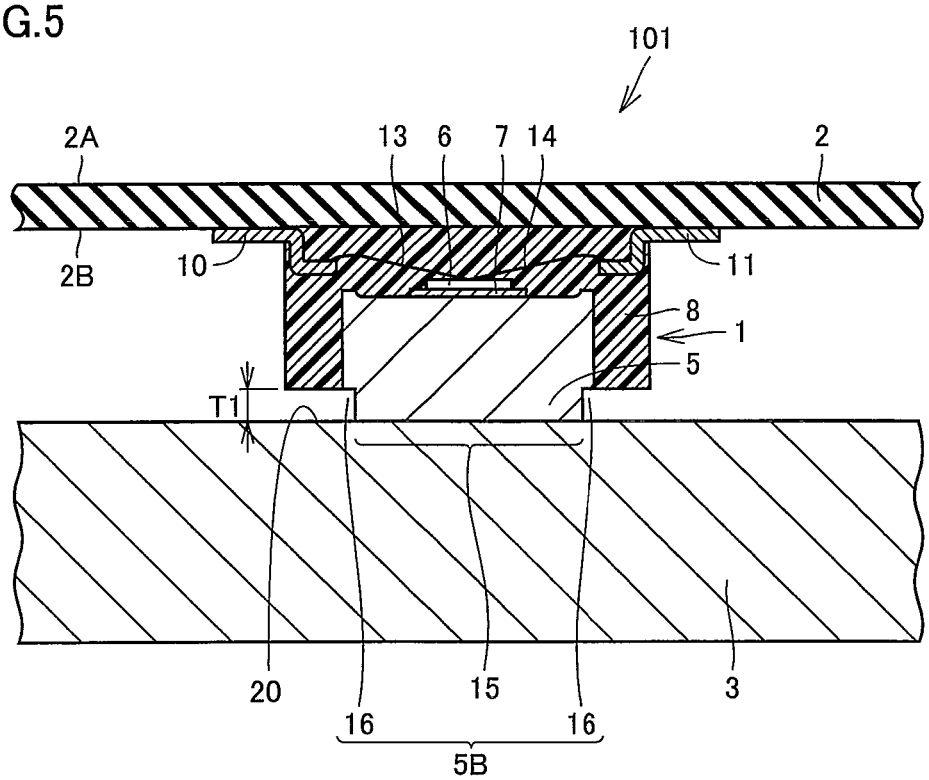
FIG. 5 is a cross-sectional view taken along V-V in FIG. 1.

FIG. 5 is a cross-sectional view taken along V-V in FIG. 1. Semiconductor device 1 includes lead terminals 10, 11 and wires 13, 14. Wire 13 connects lead terminal 10 with a bonding pad (not shown) formed on semiconductor chip 6. Wire 14 connects lead terminal 11 with a bonding pad (not shown) formed on semiconductor chip 6.

Main surface 5B of base frame 5 has a central portion 15 and a peripheral portion 16. Central portion 15 protrudes downward in high-frequency amplifier 101 below peripheral portion 16. In other words, main surface 5B has a convex portion. Sealing resin 8 covers the periphery of the convex portion (central portion 15) of main surface 5B. The surface of sealing resin 8 is formed at a location recessed from central portion 15 of main surface 5B. If the surface of sealing resin 8 and main surface 5B of base frame 5 are at approximately the same level, the contact between main surface 5B of base frame 5 and main surface 20 of heat sink 3 may be insufficient due to the roughness of main surface 20 of heat sink 3. Since central portion 15 of main surface 5B protrudes from sealing resin 8, base frame 5 can be reliably brought into contact with main surface 20 of heat sink 3.

Step height T1 is a height difference between the surface of sealing resin 8 and central portion 15 of main surface 5B of base frame 5. Step height T1 is preferably 10 μm or more. Step height T1 of 10 μm can reduce the possibility that the contact between central portion 15 of main surface 5B of base frame 5 and main surface 20 of heat sink 3 is hindered by sealing resin 8.

Lead terminals 9A, 9B are connected with grounding patterns 2D, 2C of circuit board 2 to form two paths of ground current. In the following, the path of ground current is also referred to as "ground path." One path is a path from the back surface electrode of semiconductor chip 6 to grounding pattern 2D of circuit board 2 and is formed of die bonding material 7, base frame 5, and lead terminal 9A. The other path is a path from the back surface electrode of semiconductor chip 6 to grounding pattern 2C of circuit board 2 and is formed of die bonding material 7, base frame 5, and lead terminal 9B.

In accordance with an embodiment of the present invention, additional two ground paths are formed by screws 4A and 4B. One path is a path from the back surface electrode of semiconductor chip 6 to grounding pattern 2C and is formed of die bonding material 7, base frame 5, and screw 4A. The other path is a path from the back surface electrode of semiconductor chip 6 to grounding pattern 2D and is formed of die bonding material 7, base frame 5, and screw 4B.

Figure 6:
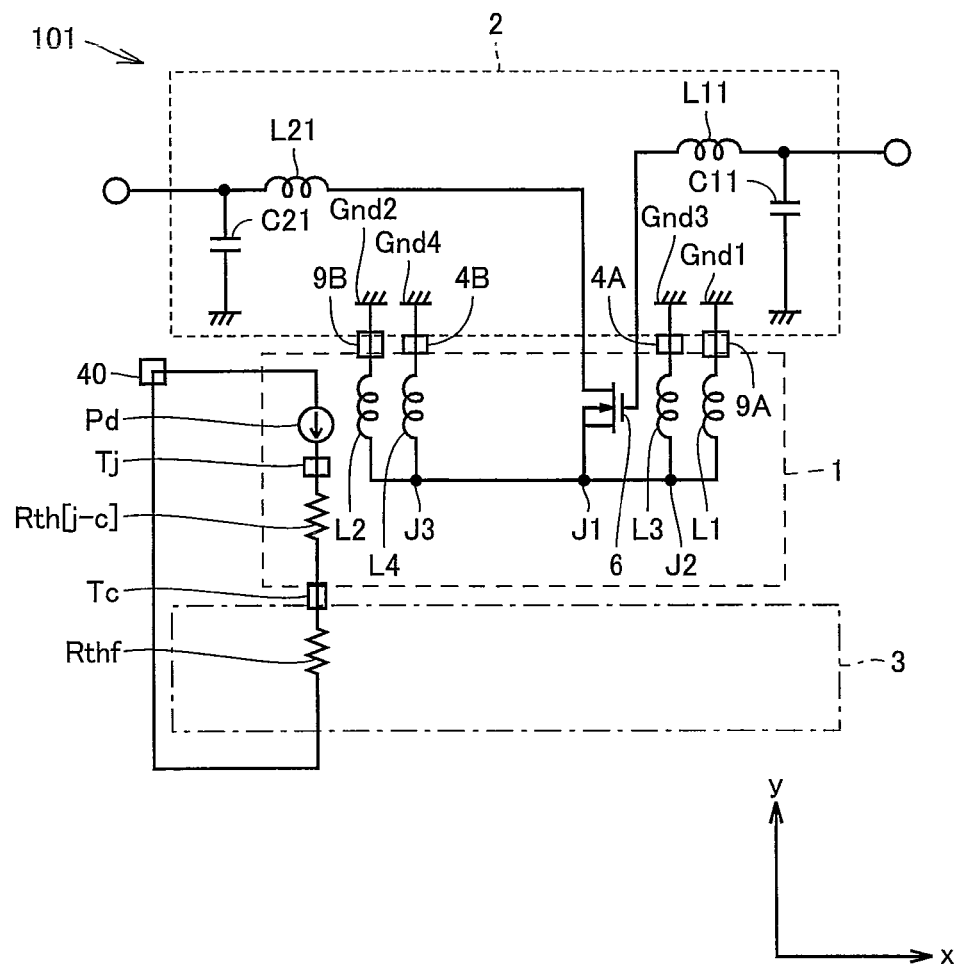
FIG. 6 is a diagram showing an equivalent circuit modeling a high-frequency amplifier 101 in accordance with the first embodiment.

FIG. 6 is an equivalent circuit modeling high-frequency amplifier 101 in accordance with the first embodiment of the present invention. Referring to FIG. 6, semiconductor chip 6 is a FET. The gate of semiconductor chip 6 is connected to the input matching circuit formed of a capacitor C11 and an inductor L11. The drain of semiconductor chip 6 is connected to the output matching circuit formed of a capacitor C21 and an inductor L21. The source of semiconductor chip 6 is connected to inductors L1 to L4 for grounding at a node J1.

The gate of semiconductor chip 6 is connected to lead terminal 10 via wire 13. The drain of semiconductor chip 6 is connected to lead terminal 11 via wire 14. The source of semiconductor chip 6 corresponds to the back surface electrode of the semiconductor chip. The source of semiconductor chip 6 is connected to base frame 5 via die bonding material 7.

Node J1 corresponds to the interface between semiconductor chip 6 (including die bonding material 7) and base frame 5. Inductor L1 equivalently shows the path of ground current from semiconductor chip 6 to lead terminal 9A. Inductor L2 equivalently shows the path of ground current from semiconductor chip 6 to lead terminal 9B. Inductor L3 equivalently shows the path of ground current from semiconductor chip 6 to screw 4A. Inductor L4 equivalently shows the path of ground current from semiconductor chip 6 to screw 4B. A node J2 corresponds to one end of inductor L3. A node J3 corresponds to one end of inductor L4.

Lead terminal 9A is connected to a ground node Gnd1 of circuit board 2. Lead terminal 9B is connected to a ground node Gnd2 of circuit board 2. Screw 4A is connected to a ground node Gnd3 of circuit board 2. Screw 4B is connected to a ground node Gnd4 of circuit board 2. Ground nodes Gnd1, Gnd4 correspond to grounding pattern 2D of circuit board 2. Ground nodes Gnd2, Gnd3 correspond to grounding pattern 2C of circuit board 2.

In operation of semiconductor chip 6, electric current flows from the drain of semiconductor chip 6 to the source of semiconductor chip 6. The electric current flowing out of the source of semiconductor chip 6, that is, ground current flows through each of inductors L1 to L4 to the ground nodes (Gnd1 to Gnd4) of circuit board 2. In the first embodiment, ground current passes through each of the above-noted four paths and flows upward from semiconductor device 1.

On the other hand, when semiconductor chip 6 is operated, power Pd is consumed and semiconductor chip 6 generates heat. The heat generated by semiconductor chip 6 is dissipated into the air 40 through base frame 5 and heat sink 3. The thermal equivalent circuit of high-frequency amplifier 101 is represented by air 40, temperatures Tj, Tc, power consumption Pd, and thermal resistances Rth[j−c], Rthf.

Temperature Tj shows a junction temperature of semiconductor chip 6. Temperature Tc shows a temperature at a contact point between main surface 5B (central portion 15) of base frame 5 and main surface 20 of heat sink 3. Thermal resistance Rth[j−c] shows junction-to-case thermal resistance from the connection portion between semiconductor chip 6 and base frame 5 to main surface 5B (central portion 15) of base frame 5. Rthf shows thermal resistance from the upper surface (main surface 20) of heat sink 3 to the lower surface of heat sink 3. The lower surface of heat sink 3 is in contact with air 40. Heat generated in semiconductor chip 6 flows through base frame 5 and heat sink 3 downward from heat sink 3. In other words, in accordance with the first embodiment, both ground current and thermal flow along the y-axis direction. However, the direction of ground current and the direction of thermal flow are separated from each other such that the direction of ground current and the direction of thermal flow are opposite to each other. Thus, the size of the semiconductor module can be reduced.

Furthermore, in accordance with the first embodiment, in addition to lead terminals 9A, 9B, screws 4A, 4B form the paths of ground current, thereby increasing the number of paths of ground current. Accordingly, the back surface electrode (grounding electrode) of semiconductor chip 6 can be reliably grounded.

Therefore, in accordance with the first embodiment, a semiconductor module capable of efficient heat dissipation and reliable grounding with a reduced size can be obtained. In this respect, comparisons between the first embodiment and comparative examples will be described below.

Comparative Examples

Figure 7:
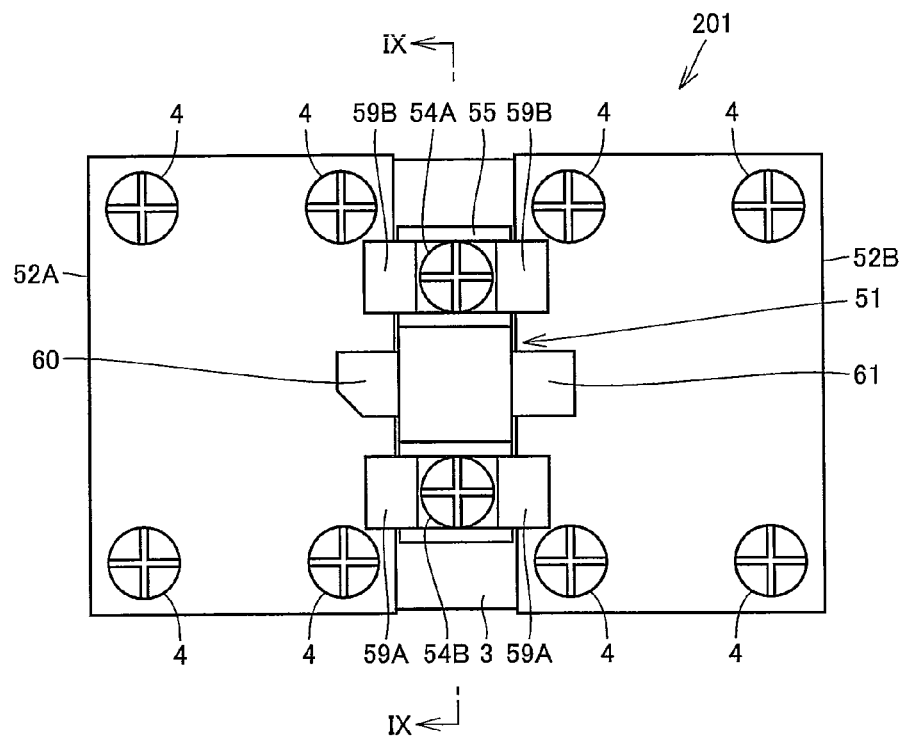
FIG. 7 is a top view showing a first comparative example of the high-frequency amplifier in accordance with an embodiment of the present invention.
Figure 8:
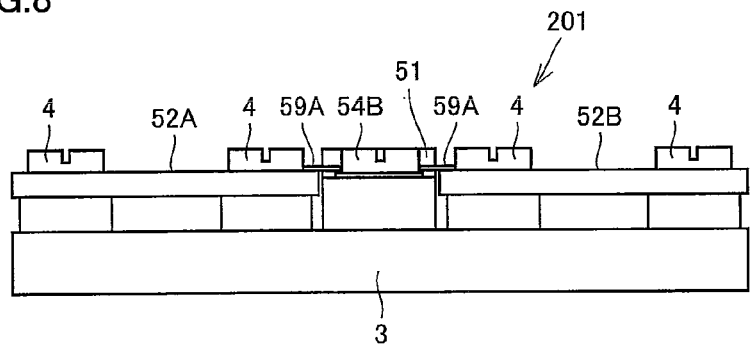
FIG. 8 is a front view of the comparative example shown in FIG. 7.

FIG. 7 is a top view showing a first comparative example of the high-frequency amplifier in accordance with an embodiment of the present invention. FIG. 8 is a front view of the comparative example shown in FIG. 7.

Referring to FIG. 7 and FIG. 8, a high-frequency amplifier 201 has a semiconductor device 51, circuit boards 52A, 52B, heat sink 3, and lead terminals 59A, 59B, 60, 61. Lead terminals 59A, 59B are provided independently from semiconductor device 51. Lead terminals 59A and 59B are terminals for grounding, and lead terminals 60 and 61 are an output terminal and an input terminal, respectively.

Circuit boards 52A and 52B are an input matching circuit and an output matching circuit, respectively. Semiconductor device 51 is arranged on a surface of heat sink 3. Semiconductor device 51 is electrically connected to circuit boards 52A, 52B via lead terminals 60, 61. Semiconductor device 51 is fixed to heat sink 3 by screws 54A, 54B and connected to lead terminals 59A, 59B. Lead terminals 59A, 59B are electrically connected to a grounding pattern (not shown) of each of circuit boards 52A and 52B.

Figure 9:
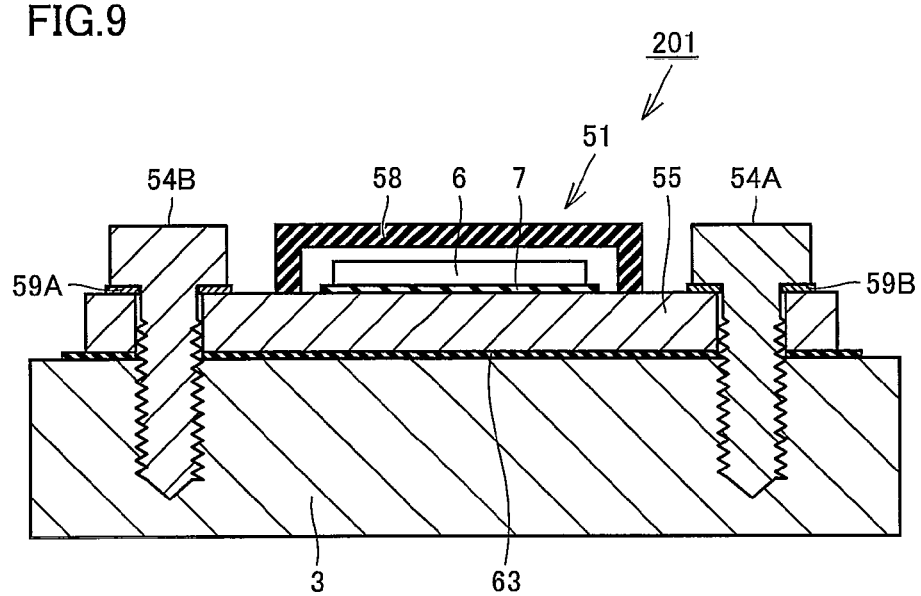
FIG. 9 is a cross-sectional view taken along IX-IX in FIG. 7.

FIG. 9 is a cross-sectional view taken along IX-IX in FIG. 7. Referring to FIG. 9, semiconductor device 51 includes a base frame 55, semiconductor chip 6, die bonding material 7, and a cover 58. The main component of base frame 55 is a metal (for example, copper). Unlike the first embodiment of the present invention, a concave portion is not formed in the main surface of base frame 55. Die bonding material 7 electrically and thermally connects semiconductor chip 6 to base frame 55. Cover 58 covers semiconductor chip 6. Lead terminals 59A, 59B are brought into intimate contact with base frame 55 by screws 54A, 54B. Lead terminals 59A, 59B are connected to circuit boards 52A, 52B, for example, by a method such as soldering.

Thermal grease 63 is interposed in a gap between base frame 55 and heat sink 3 so that heat produced by semiconductor chip 6 easily escapes to heat sink 3. If thermal grease 63 is an insulating material, electrical connection between base frame 55 and heat sink 3 is inhibited. However, the back surface electrode of semiconductor chip 6 is connected to the grounding pattern of each of circuit boards 52A, 52B through die bonding material 7, base frame 55, and lead terminals 59A, 59B. Thus, paths of ground current output from the back surface electrode of semiconductor chip 6 are formed.

Figure 10:
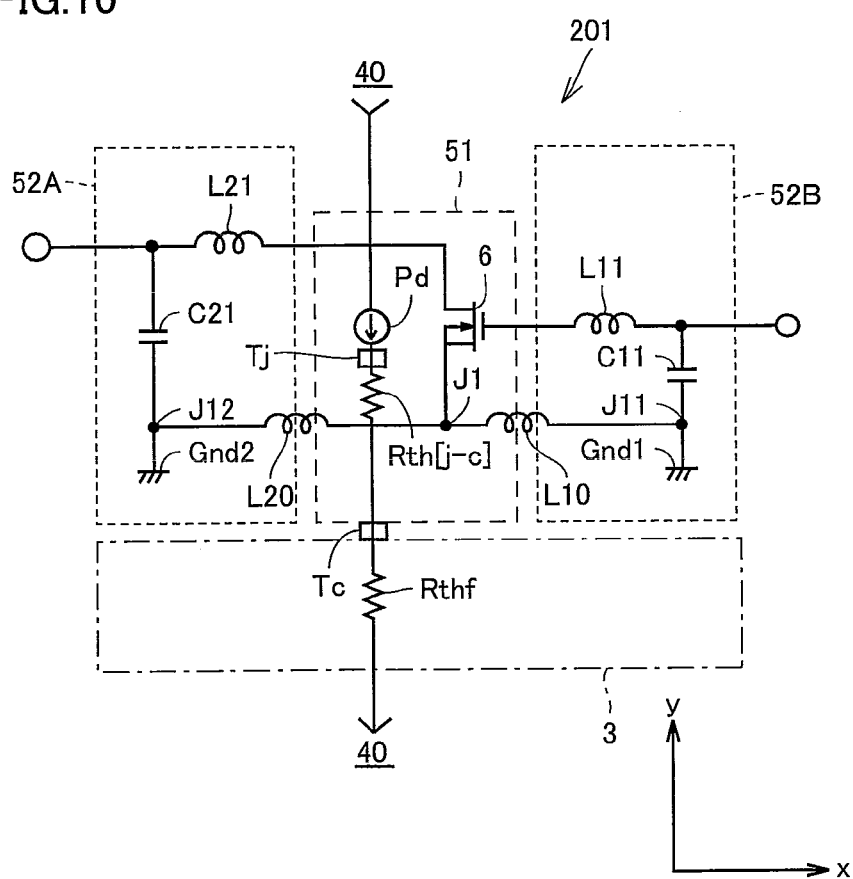
FIG. 10 is a diagram showing an equivalent circuit modeling components of a high-frequency amplifier 201 shown in FIG. 7 to FIG. 9.

FIG. 10 is a diagram showing an equivalent circuit modeling components of high-frequency amplifier 201 shown in FIG. 7 to FIG. 9. Referring to FIG. 10, a node J1 is a connection point between semiconductor chip 6 and inductors L10, L20 for grounding. Node J1 shows the interface between semiconductor chip 6 (including die bonding material 7) and base frame 55.

Inductor L10 for grounding corresponds to a part that connects each of lead terminals 59A, 59B to circuit board 52A. Inductor L20 for grounding corresponds to a part that connects each of lead terminals 59A, 59B to circuit board 52B. Inductor L10 for grounding is connected with ground node Gnd1 of circuit board 52A at a node J11. Inductor L20 for grounding is connected with ground node Gnd2 of circuit board 52B at a node J12. Circuit board 52A has an inductor L21 and a capacitor C21 connected to the drain of semiconductor chip 6. Circuit board 52B has an inductor L11 and a capacitor C11 connected to the gate of semiconductor chip 6.

Circuit boards 52A, 52B and semiconductor device 51 are arranged on heat sink 3 and arranged along the x-axis direction. Electric current output from the source of semiconductor chip 6 flows into ground node Gnd2 of circuit board 52A through inductor L20 for grounding and also flows into ground node Gnd1 of circuit board 52B through inductor L10 for grounding. Therefore, ground current flows in the horizontal direction (x-axis direction).

On the other hand, junction temperature Tj of semiconductor chip 6 is thermally connected with air 40 through thermal resistance Rth[j-c] and thermal resistance Rthf. Thermal resistance Rth[j-c] shows junction-to-case thermal resistance from the junction portion between semiconductor chip 6 and base frame 55 to the lower surface of base frame 55. Thermal resistance Rthf shows thermal resistance between heat sink and air, that is, thermal resistance from the upper surface (including thermal grease 63) of heat sink 3 to the lower surface of heat sink 3 that is thermally connected with the air. Similarly to the first embodiment, heat produced in semiconductor chip 6 flows downward from semiconductor device 51.

In the first comparative example, semiconductor device 51 is arranged between circuit boards 52A and 52B. Therefore, electric current output from the back surface electrode of semiconductor chip 6 flows in the horizontal direction. Therefore, the horizontal length of the high-frequency amplifier is increased.

Figure 11:
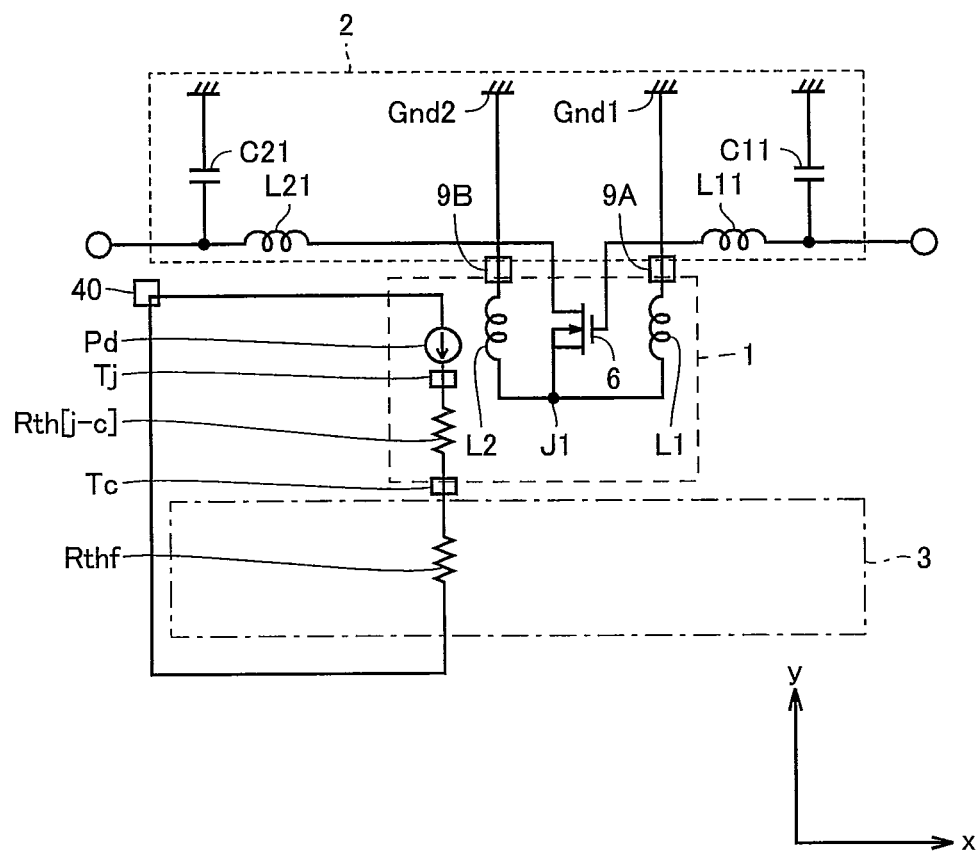
FIG. 11 is an equivalent circuit diagram for illustrating a second comparative example of the high-frequency amplifier in accordance with an embodiment of the present invention.

FIG. 11 is an equivalent circuit diagram illustrating a second comparative example of the high-frequency amplifier in accordance with an embodiment of the present invention.

Referring to FIG. 11 and FIG. 6, a high-frequency amplifier 202 differs from high-frequency amplifier 101 in that screws 4A, 4B are omitted. More specifically, high-frequency amplifier 202 has a path formed of inductor L3 for grounding and screw 4A and a path formed of inductor L4 for grounding and screw 4B.

Electric current output from the source of semiconductor chip 6 flows along the y-axis direction upward from semiconductor device 1. Heat generated by semiconductor chip 6 flows along the y-axis direction downward from semiconductor device 1. Similar to the first embodiment, in accordance with the second comparative example, the direction of electric current and the direction of thermal flow are separated from each other such that the direction of electric current and the direction of thermal flow are opposite to each other. However, in the second comparative example, two screws for fixing semiconductor device 1 to the circuit board are omitted. Therefore, in accordance with the second comparative example, the number of paths of ground current is two.

It is noted that when semiconductor device 1 shown in FIG. 11 is replaced with a mold package shown in Japanese Patent Laying-Open No. 2007-165442, the mold package cannot be fixed to the circuit board by screws. Therefore, the number of paths of ground current cannot be increased.

On the other hand, in the first embodiment, circuit board 2 is arranged above semiconductor device 1. In addition, each of lead terminals 9A, 9B and screws 4A, 4B forms a path of ground current. In accordance with the first embodiment, the direction of ground current and the direction of thermal flow can be separated from each other. Yet, the number of paths of ground current can be increased. Therefore, in accordance with the first embodiment, the semiconductor chip can be grounded reliably, and in addition, heat generated in the semiconductor chip can be dissipated efficiently. Furthermore, ground current flows above the semiconductor device, thereby preventing an increase in horizontal length of the high-frequency amplifier.

It is noted that coplanarity of lead terminals 9A, 9B is preferably 300 μm or less in order to facilitate reflow soldering for connecting lead terminals 9A, 9B of semiconductor device 1 to circuit board 2.

Figure 12:
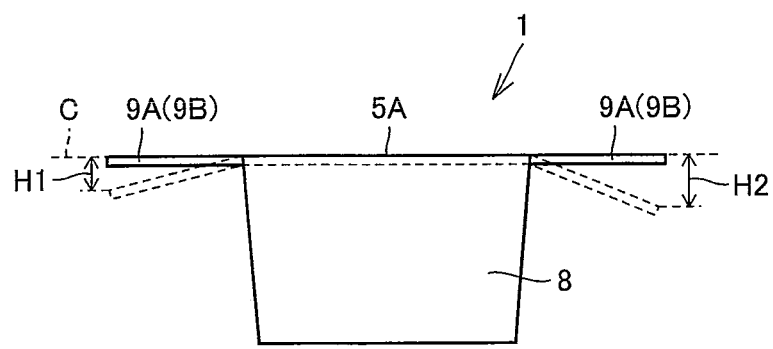
FIG. 12 is a diagram for illustrating coplanarity of lead terminals 9A, 9B.

FIG. 12 is a diagram for illustrating coplanarity of lead terminals 9A, 9B. Referring to FIG. 12, a plane C is a reference plane for defining coplanarity of lead terminals 9A, 9B. Reference plane C is a plane extending from the surface of base frame 5 that is exposed from sealing resin 8, that is, main surface 5A. In the following description, the length in the direction vertical to reference plane C is defined as the height, and the location of reference plane C is defined as the reference location in height. Coplanarity of lead terminals 9A, 9B is the height from the reference location of the main surface of lead terminals 9A, 9B (the surface connected to the grounding pattern of circuit board 2). Specifically, heights H1, H2 shown in FIG. 12 show coplanarity of lead terminal 9A (or 9B). When coplanarity of lead terminals 9A, 9B is limited to 300 μm or less, lead terminals 9A, 9B can be reliably connected to the grounding pattern of circuit board 2 by solder.

Second Embodiment

Figure 13:
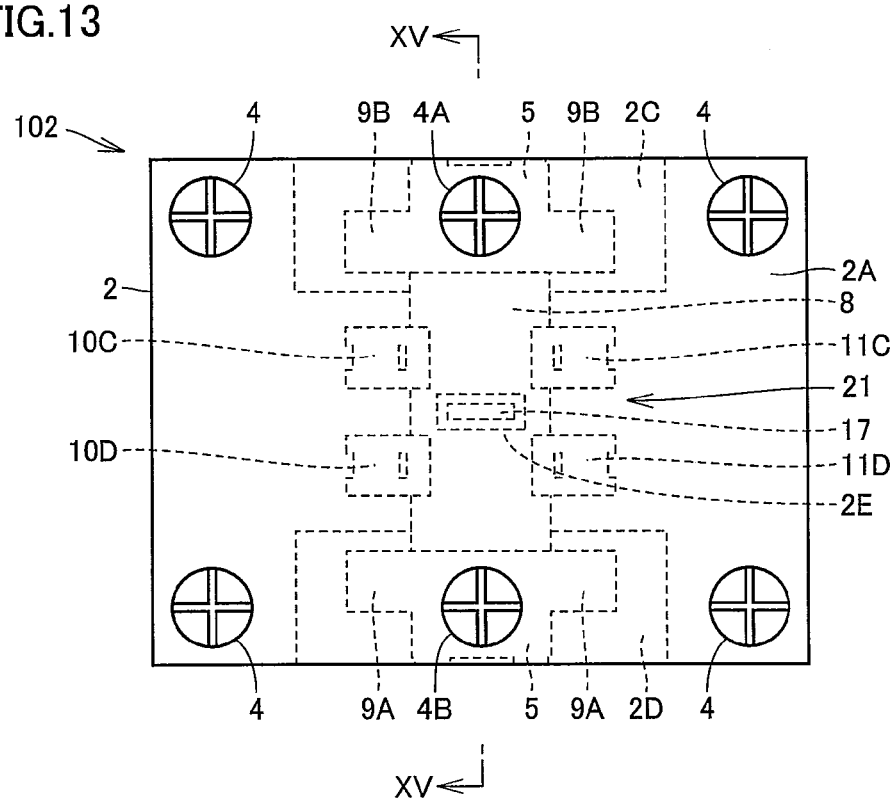
FIG. 13 is a top view of a high-frequency amplifier 102 in accordance with a second embodiment of the present invention.
Figure 14:
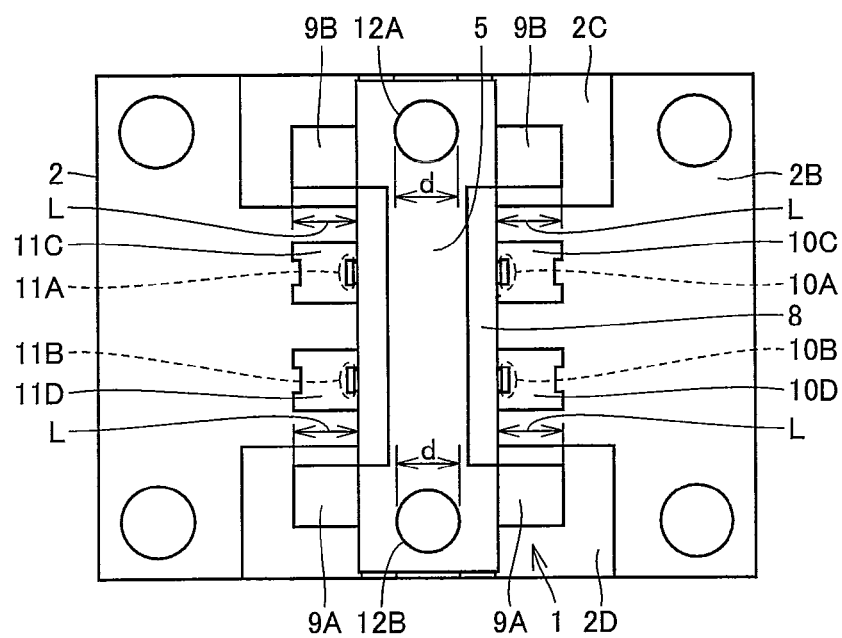
FIG. 14 is a plan view showing a semiconductor device included in high-frequency amplifier 102.
Figure 15:
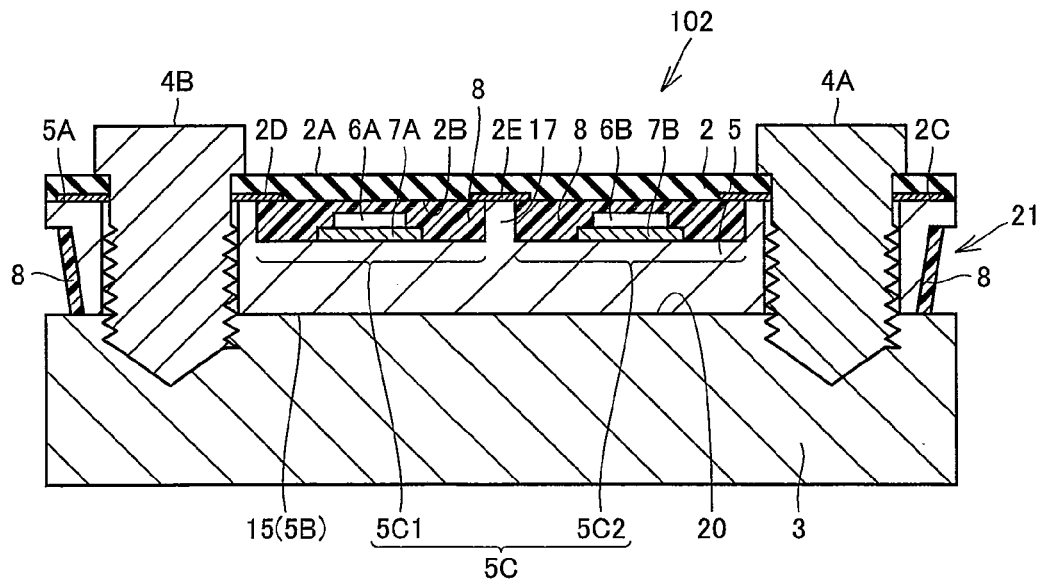
FIG. 15 is a cross-sectional view of high-frequency amplifier 102 taken along XV-XV in FIG. 13.

FIG. 13 is a top view of a high-frequency amplifier 102 in accordance with a second embodiment of the present invention. FIG. 14 is a plan view showing a semiconductor device included in high-frequency amplifier 102. FIG. 15 is a cross-sectional view of high-frequency amplifier 102 taken along XV-XV in FIG. 13.

Referring to FIG. 13 to FIG. 15, high-frequency amplifier 102 includes a semiconductor device 21. Semiconductor device 21 has semiconductor chips 6A, 6B.

In the second embodiment, concave portion 5C is divided into concave portions 5C1 and 5C2 by a grounding portion 17. Semiconductor chips 6A and 6B are arranged in concave portions 5C1 and 5C2, respectively. Semiconductor chip 6A is joined to base frame 5 through die bonding material 7A. Semiconductor chip 6B is joined to base frame 5 through die bonding material 7B.

Grounding portion 17 is a part of base frame 5. Grounding portion 17 is a protrusion portion formed to extend upward from the bottom surface of concave portion 5C. Grounding portion 17 has a surface exposed on the surface of sealing resin 8. This exposed surface is used as a soldering surface. Thus, grounding portion 17 is electrically connected with a grounding pattern 2E provided in circuit board 2. Like grounding patterns 2C, 2D, grounding pattern 2E has a ground potential.

Semiconductor device 21 has lead terminals 10C, 10D and lead terminals 11C, 11D. Lead terminal 10C and lead terminal 11C are electrically connected to the input terminal and the output terminal, respectively, of one of semiconductor chips 6A and 6B. Lead terminal 10D and lead terminal 11D are electrically connected to the input terminal and the output terminal, respectively, of the other of semiconductor chips 6A and 6B. Similar to the first embodiment, lead terminals 9A and 9B are connected to grounding patterns 2D and 2C of circuit board 2, respectively.

It is noted that the configuration of the other part of high-frequency amplifier 102 is similar to the configuration of the corresponding part of high-frequency amplifier 101 in accordance with the first embodiment, and therefore, a detailed description thereof will not be repeated hereinafter. Like the first embodiment, length L of each of lead terminals 9A and 9B with respect to the side surface of sealing resin 8 is preferably 0.15 mm or more. Furthermore, coplanarity of lead terminals 9A, 9B is preferably 300 μm or less. Diameter d of each of through holes 12A and 12B is preferably 2 mm or more.

Grounding portion 17 strengthens the grounding of the region interposed between semiconductor chips 6A and 6B. Therefore, at least three ground paths can be secured for each semiconductor chip. The location of grounding portion 17 is preferably in the middle of the region between semiconductor chips 6A and 6B. Thus, the length of the path of ground current from semiconductor chip 6A to grounding portion 17 and the length of the path of ground current from semiconductor chip 6B to grounding portion 17 can be made equal to each other. Therefore, the effect of strengthening the grounding of semiconductor chips 6A, 6B is further enhanced.

Figure 16:
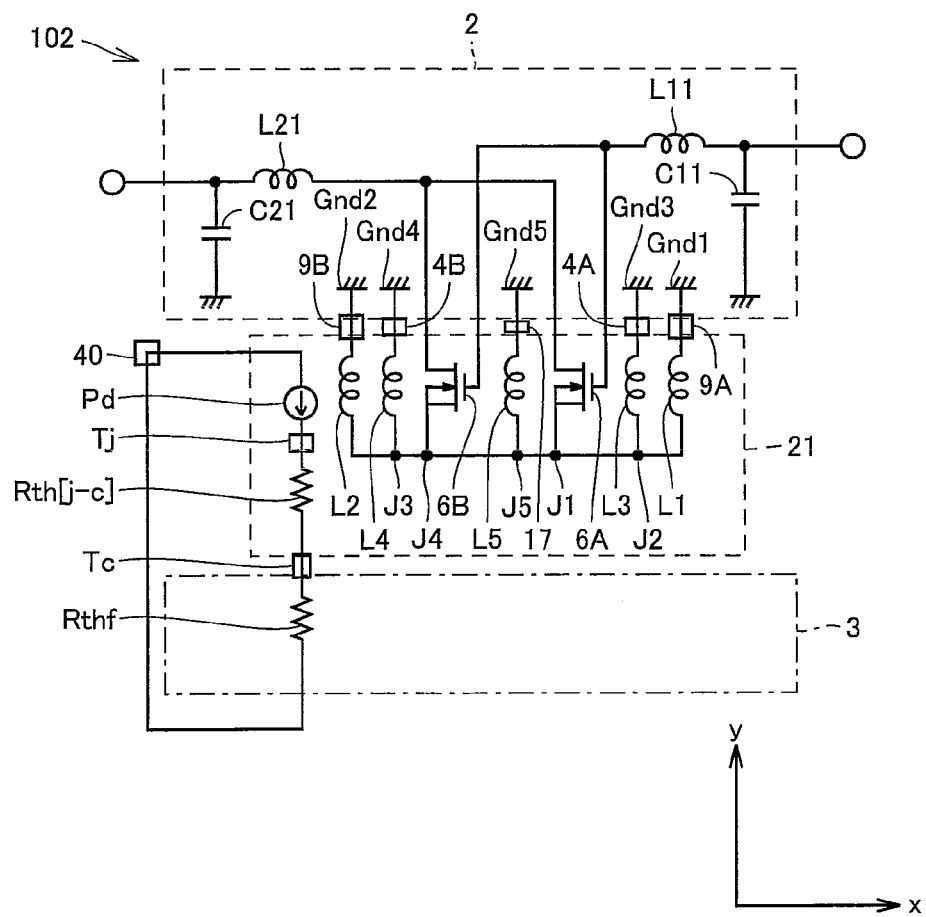
FIG. 16 is a diagram showing an equivalent circuit modeling high-frequency amplifier 102 in accordance with the second embodiment.

FIG. 16 is a diagram showing an equivalent circuit modeling high-frequency amplifier 102 in accordance with the second embodiment. Referring to FIG. 16, the gate of each semiconductor chip 6A, 6B is connected to an input matching circuit formed of capacitor C11 and inductor L11. The drain of each semiconductor chip 6A, 6B is connected to an output matching circuit formed of capacitor C21 and inductor L21. The source of semiconductor chip 6A is connected to inductors L1 to L5 for grounding at a node J1. The source of semiconductor chip 6B is connected to inductors L1 to L5 for grounding at a node 14.

Node J1 corresponds to the interface between semiconductor chip 6A (including die bonding material 7A) and base frame 5. Node J4 corresponds to the interface between semiconductor chip 6B (including die bonding material 7B) and base frame 5. A node J5 is located between nodes J1 and J4.

Inductor L5 equivalently shows a current path from semiconductor chips 6A, 6B to the exposed surface of grounding portion 17. The exposed surface is connected to a ground node Gnd6 of circuit board 2. Ground node Gnd6 corresponds to grounding pattern 2E. Grounding portion 17 (inductor L5) forms a path through which ground current flows upward from semiconductor device 21.

In accordance with the second embodiment, the number of paths through which ground current flows upward from semiconductor device 21 can be increased, as compared with the first embodiment. Furthermore, in accordance with the second embodiment, a path of ground current can be formed between two semiconductor chips, so that the path of ground current can be shortened. Therefore, in accordance with the second embodiment, the grounding of each semiconductor chip can be further strengthened.

In the second embodiment, the number of semiconductor chips is not limited to two as long as it is two or more. If the semiconductor device includes (n+1) semiconductor chips (where n is an integer equal to or larger than 1), n grounding portions are formed to extend upward from the middle location between two semiconductor chips adjacent to each other. The surface of each of n grounding portions is exposed on the surface of sealing resin 8. Their exposed surfaces are connected to the grounding patterns (corresponding to grounding pattern 2E) of circuit board 2 by solder.

Third Embodiment

Figure 17:
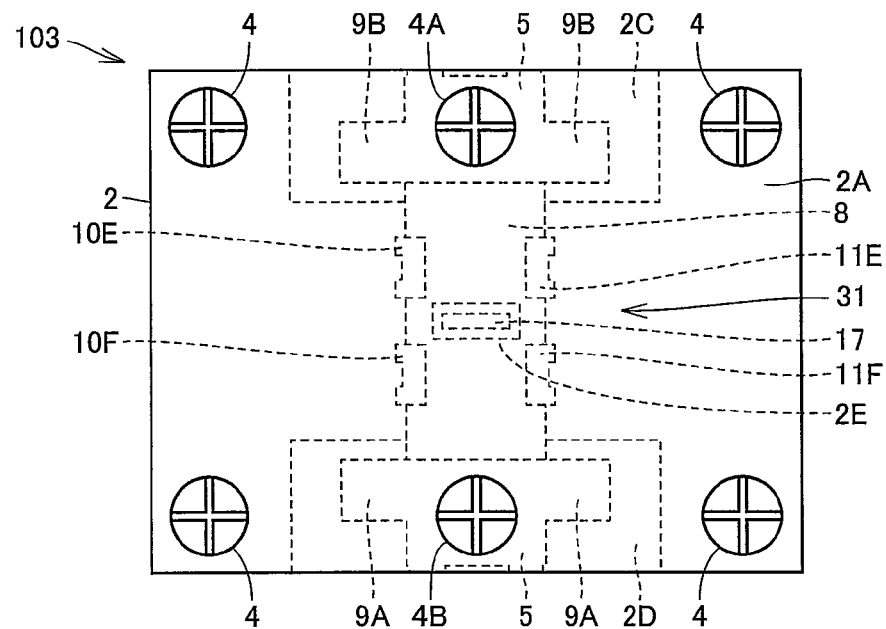
FIG. 17 is a top view showing a high-frequency amplifier 103 in accordance with a third embodiment of the present invention.
Figure 18:
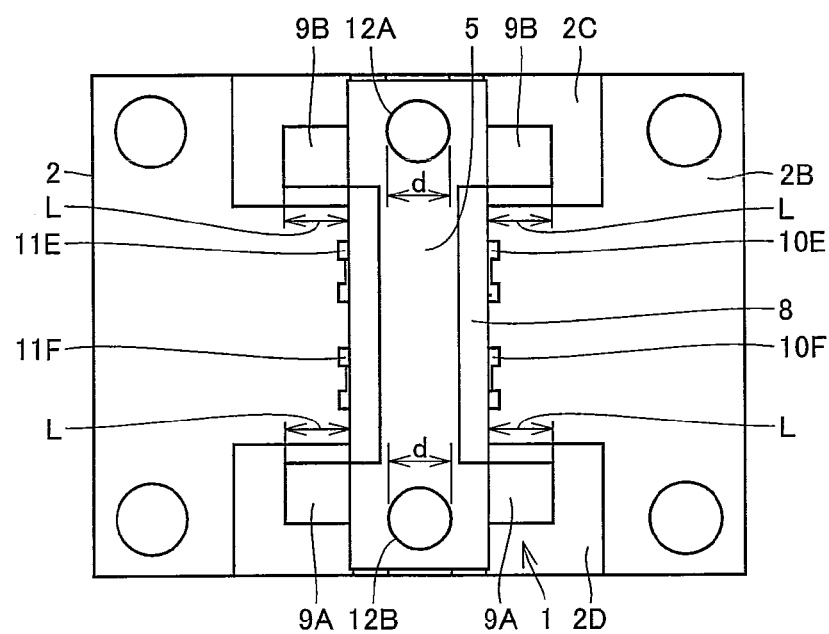
FIG. 18 is a top view showing a semiconductor device included in high-frequency amplifier 103.

FIG. 17 is a top view of a high-frequency amplifier 103 in accordance with a third embodiment of the present invention. FIG. 18 is a plan view showing a semiconductor device included in high-frequency amplifier 103.

Referring to FIG. 17 and FIG. 18, high-frequency amplifier 103 includes a semiconductor device 31. Semiconductor device 31 includes lead terminals 10E, 10F and lead terminals 11E, 11F.

As can be understood from the comparison between FIG. 17 and FIG. 13 or the comparison between FIG. 18 and FIG. 14, semiconductor device 31 in accordance with the third embodiment differs from semiconductor device 21 in accordance with the second embodiment in the shape of the input terminal and the output terminal. Specifically, the length of lead terminals 10E, 10F from the surface of sealing resin 8 is shorter than the length of lead terminals 10C, 10D from the surface of sealing resin 8. This is applicable to lead terminals 11E, 11F.

Lead terminals 10E, 10F, 11E, 11F can be formed by cutting lead terminals 10C, 10D at the locations of through holes 10A, 10B by tie bar cutting. It is noted that lead terminal 10 and lead terminal 11 of semiconductor device 1 in accordance with the first embodiment can be shortened, similarly to the third embodiment.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A semiconductor module comprising:
   at least one semiconductor chip;
   a base frame having a main surface having a concave portion in which said at least one semiconductor chip is mounted, said base frame being thermally and electrically connected with said at least one semiconductor chip;

a circuit board having a first grounding pattern and being arranged on said main surface of said base frame;

a first lead terminal being integrally formed with said base frame and being connected to said first grounding pattern of said circuit board; and a connection member electrically connecting an outer peripheral portion of said concave portion that is a part of said main surface of said base frame, to said first grounding pattern of said circuit board, and mechanically connecting said base frame to said circuit board, wherein said base frame further includes a heat dissipating surface being located opposite to said main surface and having a convex portion, said semiconductor module further comprises a resin for covering a part of said main surface of said base frame so as to fill said concave portion, and for covering a periphery of said convex portion, said connection member is a screw, a hole through which said screw is passed is formed in each of said outer peripheral portion of said main surface and said first grounding pattern of said circuit board, said semiconductor module further comprises a heat sink being in contact with said convex portion of said heat dissipating surface and fixing said base frame and said circuit board by said screw, and said outer peripheral portion of said main surface is brought into contact with said first grounding pattern by said screw.

2. The semiconductor module according to claim 1, wherein said base frame includes a protrusion portion formed to divide said concave portion into a first concave portion and a second concave portion, said circuit board further has a second grounding pattern being connected to said protrusion portion and having a potential equal to a potential of said first grounding pattern, and said at least one semiconductor chip includes first and second semiconductor chips arranged in said first and second concave portions, respectively, such that said protrusion portion is sandwiched between said first and second semiconductor chips.

3. The semiconductor module according to claim 1, wherein a length of a part of said first lead terminal that protrudes from a surface of said resin is 0.15 mm or more.

4. The semiconductor module according to claim 1, wherein when a length in a direction vertical to said main surface of said base frame is defined as a height, the height of said first lead terminal with reference to a region of a part of said main surface exposed from said resin is 0.3 mm or less.

5. The semiconductor module according to claim 1, wherein a diameter of said hole is 2 mm or more.

6. The semiconductor module according to claim 1, further comprising a second lead terminal being electrically connected with said at least one semiconductor chip, wherein a through hole is formed in said second lead terminal.

7. A semiconductor device comprising:

at least one semiconductor chip;

a base frame having a main surface having a concave portion in which said at least one semiconductor chip is mounted, said base frame being thermally and electrically connected with said at least one semiconductor chip; and a lead terminal being integrally formed with said base frame and being connected to a grounding pattern of a circuit board arranged on said main surface of said base frame, wherein a hole through which a connection member for mechanically and electrically connecting said base frame to said circuit board is passed is formed in an outer peripheral portion of said concave portion that is a part of said main surface of said base frame, said base frame further includes a heat dissipating surface being located opposite to said main surface and having a convex portion, said semiconductor device further comprises a resin for covering a part of said main surface of said base frame so as to fill said concave portion, and for covering a periphery of said convex portion, said connection member is a screw, said hole is a hole through which said screw is passed and formed in each of said outer peripheral portion of said main surface and a first grounding pattern of said circuit board, said semiconductor device further comprises a heat sink being in contact with said convex portion of said heat dissipating surface and fixing said base frame and said circuit board by said screw, and said outer peripheral portion of said main surface is brought into contact with said first grounding pattern by said screw.

\* \* \* \* \*